United States Patent [19]

Adamo et al.

[11] Patent Number: 4,546,283
[45] Date of Patent: Oct. 8, 1985

[54] CONDUCTOR STRUCTURE FOR THICK FILM ELECTRICAL DEVICE

[75] Inventors: Michael D. Adamo, Bloomfield, Conn.; Cederick U. Darter; Frederick Y. Cho, both of Scottsdale, Ariz.

[73] Assignee: The United States of America as represented by the Secretary of the Air Force, Washington, D.C.

[21] Appl. No.: 607,094

[22] Filed: May 4, 1984

[51] Int. Cl.⁴ .................. H01L 41/08; H05K 7/02
[52] U.S. Cl. ...................... 310/313 R; 310/345; 310/348; 310/364; 333/150; 361/397
[58] Field of Search ........... 310/313 R, 313 A, 313 B, 310/313 C, 313 D, 345, 348, 364, 334; 428/901; 361/397, 400, 404, 408, 411; 174/68.5; 333/150, 154, 193

[56] References Cited

U.S. PATENT DOCUMENTS

| | | | |
|---|---|---|---|
| 2,497,666 | 2/1950 | Gravley | 310/364 |
| 3,453,711 | 7/1969 | Miller | 310/366 X |
| 3,686,518 | 8/1972 | Hartmann et al. | 310/313 B |
| 3,855,693 | 12/1974 | Umbaugh | 361/408 X |
| 3,959,747 | 5/1976 | Turski et al. | 310/364 X |
| 4,034,467 | 7/1977 | Sapunarow | 361/397 X |
| 4,035,576 | 7/1977 | Henry | 361/397 X |
| 4,088,828 | 5/1978 | Yamamoto et al. | 361/397 X |
| 4,194,171 | 3/1980 | Jelks | 333/149 |
| 4,236,095 | 11/1980 | Ono et al. | 310/313 A |
| 4,339,683 | 7/1982 | Scott et al. | 310/364 |
| 4,369,390 | 1/1983 | Malocha et al. | 310/313 B |
| 4,409,510 | 10/1983 | Assenza et al. | 310/336 X |

*Primary Examiner*—Mark O. Budd
*Attorney, Agent, or Firm*—Donald J. Singer; Gerald B. Hollins

[57] ABSTRACT

A thick film device conductor arrangement suitable for making connections between a resiliently mounted element such as a surface acoustic delay line and adjacent thick film conductors and then with the device connecting pins. The thick film conductors include a double layer structure of differing noble metals each selected for desirable properties in designated areas of the device.

20 Claims, 1 Drawing Figure

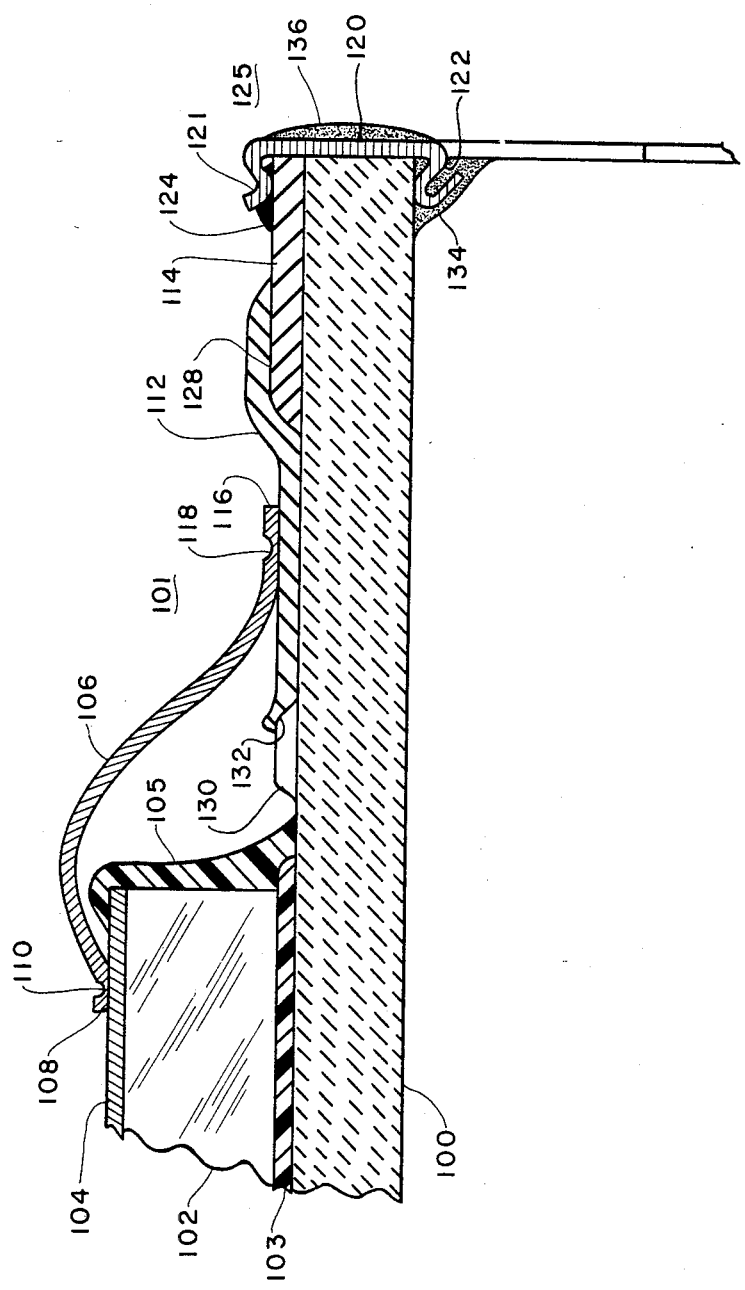

CONDUCTOR STRUCTURE FOR THICK FILM ELECTRICAL DEVICE

RIGHTS OF THE GOVERNMENT

The invention described herein may be manufactured and used by or for the Government of the United States for all governmental purposes without the payment of any royalty.

CROSS REFERENCES TO RELATED APPLICATIONS

This application is one of a group of three filed on the same date concerning somewhat related inventions. The other two applications are identified by Ser. Nos. 06/607,089 and 06/607,087.

BACKGROUND OF THE INVENTION

This invention relates to the field of sintered metal conductors on ceramic substrate materials and bonded conductors such as might be employed in a thick film electrical circuit, for example a surface acoustic wave delay line.

Surface acoustic wave transducers and delay lines find increasing acceptance in modern electronic signal processing in such fields as target detection, voice recognition, mineral exploration, and visual image processing. In each of these applications a need frequently arises to delay the presentation of signals representing one sample of information in order that this sample be compared with a later occuring and related sample of the same information. The surface acoustic wave delay line wherein this delay is achieved by way of the acoustic propagation of radio frequency signals along the surface of a piezoelectrical crystal is a frequent choice of equipment designers for achieving this delay. The ease with which electrical signals can be transduced into physical or mechanical vibrations and then returned to electrical signal form in a piezoelectrical crystal device such as lithium niobate is one reason for this increasing acceptance of surface acoustical wave devices. Other features of these delay lines including realistic time delays, small physical size and mass, and tolerable temperature characteristics, also contribute to this acceptance.

This increasing popularity of surface acoustic wave devices has prompted the United States Air Force to support a program for improving the manufacturing techniques for these devices and to consider innovations which improve the performance and manufactureability of these devices.

Surface acoustic wave devices, thick film structures, and metalization for thick film structures are known in the prior patent art as is shown by the following examples of U.S. patents. The patent of Edwards C. Jelks U.S. Pat. No. 4,194,171 concerns a surface acoustic wave device which is used to perform the mathematical Fourier transform operations and provide a serial output signal from a parallel input signal. The Jelks device employs a silicon substrate that is compatible with the integrated circuit art and attaches a plurality of surface acoustic wave transducers to this substrate rather than employing a piezoelectric material for the entire structure. The Jelks patent comtemplates the use of gold, titanium, aluminum silicon dioxide and zinc oxide materials and discloses a process for fabricating these materials into the discrete Fourier transform device. The Jelks patent is an example of the devices currently employed in signal processing circuitry, and includes a discussion of the related applications and fabrication technology.

The patent of Shusuke Ono U.S. Pat. No. 4,236,095 concerns a surface wave device which employs A-alumina as an acoustic wave transmitting substrate. The Ono substrate is coupled to a pair of piezoelectric transducers fabricated from crystalline zinc oxide. The Ono patent is especially concerned with providing good acoustic coupling between a transducer and the surface acoustic wave substrate and with the selection of materials having good surface acoustic wave properties.

The patent of William R. Scott et al. U.S. Pat. No. 4,339,683 discloses an electrical connection apparatus suitable for use on a piezoelectric material. The Scott invention uses a gold layer as an intermediary for making a low temperature solder connection. The piezoelectric material of choice in the Scott patent is polyvinylidene fluoride, a material presenting unusual electrode and lead attachment problems. The Scott patent is primarily concerned with the fabrication of a satisfactory electrode on polyvinylidene fluoride transducer members.

SUMMARY OF THE INVENTION

An object of the present invention is to provide an electrical connection arrangement suitable for use in a thick film surface acoustic wave device.

Another object of the invention is to provide a minimum cost electrical connection arrangement employing noble metals.

A further object of the invention is to provide an electrical connection arrangement which is free of problems associated with solder leaching of the materials used.

Yet a further object of the invention is to provide a connecting arrangement which is tolerant of rework and repair activity in a manufacturing environment.

Another object of the invention is to provide an electrical connection arrangement which is compatible with the use of low temperature aluminum wire bonding.

BRIEF DESCRIPTION OF THE DRAWING

The accompanying drawing shows a cross sectional view of a connecting arrangement made in accordance with the invention.

DETAILED DESCRIPTION

In the drawing there is shown a thick film surface acoustic wave delay line device which is an example of a device using the present conductor structure. The delay line device in the drawing is generally identified by the number 101 and consists of a wafer substrate member 100 on which is mounted is a surface acoustic wave delay line element 102, a pair of overlapping metal film conductors 112 and 114 a resistive element 130 and a connection pin 120. The delay line element 102 is shown to carry an electrode 104 which is connected by a bonding wire 106 to a metal film conductor 112.

The connecting pin 120 is shown to be attached to the wafer substrate 100 by way of a combined solder attachment 124, spring pressure between upper and lower resilient gripping members 121 and 122, and adhesive attachments 134 and 136.

The delay line element 102 which is partially shown in the drawing is resiliently mounted on the wafer substrate 100 by a layer of resilient material 103. The bonding wire 106 may be connected to the electrode 104 and the metal film conductor 112 by ultrasonic bonding which is the preferable method or alternately by thermal compression bonding or by other connecting techniques which are known in the art. Bonding to the electrode 104 and the metal film conductor 112 is achieved with a tool having small cross sectional area and leaving the imprints 110 and 118.

The resistive element 130 is intended to have a length which extends generally perpendicular to the plane of the drawing and to be connected to another portion of the circuit at its remote end which is not shown. The resistive element 130 generally indicates the presence of electrical components such as resistors, capacitors, semiconductor diodes, and possibly transistors in a thick film device. The interface 132 between the metal film conductor 112 and the resistive element 130 is also shown in a representive form and is fabricated through the use of thick film paste materials which are subsequently fired or fuzed at elevated temperatures according to techniques which are known in the art.

Semiconductor diodes and capacitors elements if present in the delay line device 101 are intended to be in discrete component form and attached to the metal film conductors 112 and 114 by such techniques such as reflow heating of solder tinned connecting areas, by conductive epoxy adhesive and by wire bonding in the matter indicated for the bonding wire 106. A typical component of this type is the chip diode SMVC-2172 manufactured by Motorola Incorporated of Schaumburg, Ill.

The conductive epoxy adhesive for discrete component attachment can be Ablebond 36-2 conductive epoxy manufactured by Ablestik Laboratories of St. Gardena, Ca., 90248, a division of National Starch and Chemical Corp. Epoxy adhesive attaching can be conveniently performed using a Laurier Associates Inc. chip bonder which is available from Laurier Associates, Inc., of Hudson, NH 03051. The Laurier Bonder automatically dispenses a small amount of epoxy after a component such as a diode chip is picked up by a vacuum needle. The epoxy adhesive may be cured by placing the delay line device in a 150 degrees centigrade oven for 1 hr.

Several components of the delay line device 101 have properties requiring special consideration in the arrangement of a thick film connecting conductors. Among these properties are the very smooth surfaces and brittle nature of materials used in the delay line element 102. Lithium niobate, the preferred material for the element 102 is known to have both the brittle crystal and smooth surface characteristics and presents problems of electrode attachment. In the delay line device 101 the electrode 104 is preferably made of aluminum which is vacuum vapor deposited in a planatary system; this electrode has a thickness in the range of 2000 angstroms. Aluminum wire of about 1 mill or 1000th of an inch diameter is suitable for the bonding wire 106 and is compatible with the aluminum metal of the electrode 104. Compatability in the environment of a thick film device includes considerations such as bonding strength and freedom from inter-metallic degradation such as the purple plague reaction which may occur between aluminum and gold or other metals.

Noble metals and alloys of noble metals are desirable choices for the metal film conductors 112 and 114. Certain noble metals such as alloys of platinum and gold have some merit for use in fabricating the entire array of metal film conductors in a thick film device but are susceptible to questionable wire bond integrity and high cost. The two layer arrangement shown for the device 101 is found to be a preferable alternate for a single metal platinum gold metalization.

Another property requiring consideration in the fabrication and electrical conductor arrangement of the delay line device 101 is the combination of smooth element surface and a concurrent need for physical attachment between the delay line element 102 and the wafer substrate 100. A resilient material layer has been found desireable in this location; such an attachment provides both a degree of mechanical protection for the delay line element 102 and provides minimal attenuation of the acoustic wave signal in the delay line. Silicone rubber such as the RTV 3140 compound manufactured by Dow Corning Corporation of Midland, MI has been found suitable for the resilient material 103. This compound may be of applied to the delay line element 102 using a Laurier Associates epoxy syringe model M101 set at 30 lbs per square inch and using a number 22G syringe needle. The RTV compound is deposited along the area where the delay line element is to be mounted.

Another RTV compound, RTV 3144 has been found suitable for use in the delay line loading element 105 located at the end of the surface acoustic wave crystal to attenuate the acoustic wave energy and prevent undesired acoustic reflections. The RTV 3144 damping material is applied to the crystal with an 18 G syringe set at 20 psi. Curing of both of these RTV compounds is desirable prior to performing other mechanical operations such as wire bonding.

The wire bond connections to the delay line element 102 as shown at 108 may be made using the above mentioned one mill aluminum wire and bonding accomplished on a Unitek model 1-151-02 bonder which is manufactured by Initek Industrial Equipment Operation of Monrovia, CA 91016, a division of Bristol Meyers Company. The power and duration settings on the bonder are normally at 4.0; bonds accomplished in this manner provide an average bond strength greater than 4.0 grams.

An A-alumina material has been found suitable for the wafer substrate 100 in the delay line device 101. Typically an alumina wafer of about 1 inch by 1¼ inch overall dimensions would be employed for a lithium niobate surface acoustic wave delay line. This wafer could be of a thickness of 25 mils and would in most instances be covered by some form of metallic or ceramic enclosure which is not shown in the drawing. Ceramic alumina is a commonly used material in the semiconductor art and has properties including mechanical strength which are suitable for thick film device fabrication.

Metal film conductor 112 represents the primary interconnect medium for the thick film device. The material used for the metal film conductor 112 should desirably have several properties such as compatibility with wire bonding to permit attachment of components such as the resistive element 130, be reasonably low in cost, be free of manufacturing related problems, (such as undesired responses to processing steps required for other portion of the device 101), have desireable electrical properties, be easily fabricated from paste or paint materials and especially be tolerant of the rework or corrective activity frequently required in a manufacturing environment.

A material which fully meets all of the needs for a conductor in a thick film device is not readily found. Attempts to meet these needs through the use of alloys of such metals as platinum and gold for all conductors on a thick film device have met with some success but are especially lacking in the properties of material cost and attainable wire bond integrity.

The double layer structure show in the drawing is a desirable compromise for meeting the conductor requirements for a thick film device. According to this double layer structure a first and relatively low cost material is used for the center most and largest area portion of the device 101 and this material is supplemented with another material where the properties of the large area conductor 112 are lacking.

In the delay line device 101 it has been found desirable to fabricate the large area of metal film conductor 112 from an alloy of the metals palladium and silver and to fabricate the supplementing or second layer metal film conductor 114 from an alloy of the metals platinum and gold.

The elected palladium silver alloy for the conductor 112 is found to provide good compatability with the aluminum bonding wire 106, and with an ultrasonic bonding operation. This alloy also has good electrical properties and is relatively low in cost. A suitable arrangement for fabricating metal film conductors of palladium silver alloy involves the metal paste supplied by electronic chemical suppliers such as Minnesota Mining and Manufacturing Company, E. I. DuPont de Nemours and Company (hereinafter called DuPont), Electroglass Inc., and Cermalloy. The addresses of these suppliers are, respectively, St. Paul, Minn.; 1007 Market Street, Wilmington, DE 19898; 2901 Coronado Drive, Santa Clara, CA 95051; P.O. Box 596, Union Hill Industrial Part, West Conshohocken, PA 19428.

A thick film paste which has been found particularly suitable for this purpose is the Cermalloy Inc. Paste designated by the catalog number C-4020 and supplied by Cermalloy Inc. A material suitable for fabricating the resistive elements 130 is also available from Cermalloy Inc. and is designated as Cermalloy series A,3K ohms/per sq.

Although palladium silver conductors are desirable for use in the large central areas of a thick film device this material is unsuitable for use as the only metal conductor in a thick film device of the type shown. Most notable of the problems with palladium silver is the tendency of such material to oxidize and require scrubbing or cleaning following a resistor oxidation manufacturing step and also a pronounced tendency to leach in the presence of tin-lead solder. Solder of this type has been found desirable at 124 in the drawing for attaching external leads 120. This leaching tendency of palladium silver in the presence of tin-lead solder occurs to a degree than precludes successful rework of thick film devices having a solder connection. Inability to perform a rework operation increases manufacturing costs, precludes field repair procedures and is desirably avoided in a manufacturing operation.

The use of a second noble metal alloy, in limited but critical areas is of the thich film device 101 has been found a desireable alternate to the palladium silver problems described. The pads or connecting pin attachment area of the thick film device 101 which are generally shown at 125 in the drawing is a primary area in which a platinum gold metal film conductor is found desirable. With pads made from an alloy of platinum and gold in the pin attachment area 125 the need for scrubbing following resistor oxidation is eliminated and soldering with low temperature, tin-lead-silver solder is readily accomplished. Pin attachment with low temperature solder to the platinum gold alloy also allows several rework operations without damage to the pad or adjacent areas.

An arrangement for fabricating the platinum gold metal film conductor 114 has been found to involve the use of silk screen techniques and a finely divided metallic paste, the paste material being designated as DuPont type 9596. Possible materials for use in washing of the 101 delay line apparatus are designated as TWD-602 and TF Freon degreaser and are available from DuPont. The name Freon is a DuPont Trademark.

At the interface of the palladium silver and platinum gold film conductors at 128 it is desirable to achieve a low resistance ohmic contact such as may be formed by fusing together pastes from which the conductors 112 and 114 are fabricated.

A devitrious glass dielectric which may be used with the above indicated materials at crossover locations and in other locations where insulation of the conductors is desired is available from DuPont under the trade name of DuPont 8399 devitrious glass.

The firing range for the materials indicated above is as follows: the C4020 palladium silver Cermalloy conductor material has a firing range of 760 to 980 degrees C., the DuPont 8399 devitrious glass has a firing range of 875 to 1000 degrees C., the Plessy series A resistor material has a firing range of 740 to 780 degrees C. and the DuPont 9596 platinum gold material has a firing range of 850° to 980° C.

A process flow sequence for fabricating conductors for the device 101 involves the sequential steps of:
 cleaning and prefiring the alumina substrate,
 printing and drying the front metal pastes,
 printing and drying the back metal pastes,
 firing the back metal pastes,
 printing and drying the dielectric glass,
 printing and drying the dielectric glass second layer,
 printing and drying a top metal layer,
 firing the top metal layer,
 printing and drying the resistors,
 firing the resistors.

The connecting pin 120 is frequently arranged to be part of a lead frame structure such as is available under the trade name of the Berg 75503—003 Dip-Clip manufactured by DuPont. A universal tool identified as the Berg HT-106 may be used to attach the Dip-Clip lead frame to the ceramic wafer substrate.

The solder attachment indicated at 124 in the drawing may be accomplished by dipping the substrate with the attached lead frame into a solder pot which typically contains a tin-lead-silver solder and is operated at a temperature of 230±5° C. The Kester or Alpha Metals tin-lead-silver solder may have a composition of 62% tin, 36% lead, and 2% silver. The Kester solder is available from Kester Solder Company of Chicago, Ill 60639; Kester is a division of Litton Industries Inc. Soldering can be improved with the use of a solder resin flux such as Alpha Metals number 611 manufactured for wave application by Alpha Metals Inc. of Jersey City, N.J. 07304; dilution may be accomplished with the addition of up to 50% by volume of alcohol.

Solder attachment of the lead frame to the substrate is preferably supplemented by the addition of a high temperature nonconductive epoxy adhesive fillet surrounding the lower gripping member 122 as shown at 134 in the drawing. The epoxy adhesive fillet is also extended around the edge of the substrate as shown at 136 of the drawing. A nonconductive epoxy identified in the trade as Epo-Tek H74 and manufactured by Epoxy Technology, Inc. of Billerica, Mass 01821, is found suitable for this supplemental attachment. The nonconductive nature of this epoxy permits overlap of the adhesive to adjacent pins and substrate metalization without electrical consequence.

An alternate arrangement for attaching lead frame pins to the substrate involves applying solder paste manually to the edges of each pin and heating the merged pin and substrate structure with a reflow heater such as an infrared red source for several minutes. The solder dip attachment is faster and generally preferred over the solder paste attachment method.

The connecting arrangement described herein has been found to provide several advantages in a thick film structure. The double layer conductors at 112 and 114 have been found particularly desirable for retarding oxidation and easing difficulties in solderability. This arrangement provides a net cost saving over other metallization arrangements even though the noble metals involved are not inexpensive. The reduction of scrap parts, the allowance of rework and the elimination of steps such as scrubbing the palladium silver conductor following resistor oxidation and in preparation for soldering all contribute to this overall reduction of cost.

The double layer conductor structure also allows reliable attachment of lead frame 10 by way of low temperature solder without leaching of the conductor structure metal. Leaching resistance is confirmed by the platinum gold conductor exhibiting no leaching when tested for five consecutive ten second dips in a Pb 36 Sn 62, Ag2, solder pot at 230° C. The wire bonds at the end of the one mill aluminum wire 106 are found to provide bond strength routinely exceeding 4 grams and often exceeding 5 grams in bond pull testing.

Although the invention herein has been described in terms of a surface acoustic wave delay line device, it should be understood that the invention could be employed successfully with many different types of electronic devices other than delay lines.

While the apparatus herein described constitutes a preferred embodiment of the invention, it is to be understood that the invention is not limited to this precise form of apparatus and the changes may be made therein without departing from the scope of the invention which is defined in the appended claims.

We claim:

1. Connecting apparatus for conducting electrical currents between the pins of a lead frame and a resiliently mounted piezoelectric crystal and wafer mounted electrical components in a ceramic wafer thick film structure comprising the combination of:
    aluminum film electrodes supported upon and electrically connected with said piezoelectric crystal;
    first layer electrical conductor means located on said ceramic wafer for communicating electrical currents between said wafer mounted electrical components;
    second layer electrical conductor means located on said ceramic wafer adjacent said lead frame pins and overlapping with said first layer conductor means at common predetermined fusion connection points;
    aluminum wire bond means bonded at first ends thereof to said aluminum film electrodes on said piezoelectric crystal and bonded to said first layer electrical conductor means at the other ends thereof for connecting said piezoelectric crystal to said electrical components;
    solder connecting means for connecting said second layer electrical conductor means with said lead frame pins.

2. The apparatus of claim 1 wherein said first and second electrical conductor means are each comprised of noble metals.

3. The apparatus of claim 2 wherein said first layer electrical conductor means is comprised of aluminum wire bond compatable noble metal and said second layer electrical conductor means is comprised of tin-lead solder compatible noble metal.

4. The apparatus of claim 3 wherein said noble metals are each alloys of noble metals.

5. The apparatus of claim 4 wherein said first noble metal alloy is comprised of palladium and silver.

6. The apparatus of claim 5 wherein said second noble metal alloy is comprised of platinum and gold.

7. The apparatus of claim 6 wherein said first layer electrical conductor means extends to said electrical components and to areas adjacent said piezoelectric crystal.

8. The apparatus of claim 7 wherein said wafer is comprised of ceramic alumina material.

9. The apparatus of claim 8 wherein said piezoelectric crystal is comprised of lithium niobate.

10. The apparatus of claim 9 wherein said lithium niobate crystal comprises a surface acoustic wave signal delay line.

11. Diverse conductor thick film electrical circuit apparatus comprising:
    a ceramic substrate capable of supporting thick film electrical circuit components;
    a plurality of electrical circuit components mounted on said ceramic substrate;
    an array of noble first metal alloy electrical conductors attached to said ceramic substrate and connected with terminals of said electrical components according to a predetermined electrical circuit network,
    said component connections including second metal wire bond conductors connecting one of said electrical circuit components with said first metal conductors;
    an array of noble third metal alloy electrical conductors attached to said ceramic substrate and having continuity with selected ones of said first metal conductors at predetermined conductor junction points; and
    fourth metal means connecting said third metal electrical conductors with external electrodes of said apparatus;
    whereby wire bond capability between said first and second metals is achieved in combination with minimal use of said noble third metal and with accommodation of metallic incompatibility between said first and fourth metals.

12. The apparatus of claim 11 wherein said selected continuity of noble third metal conductors and noble first metal conductors includes overlapping disposition of said noble metal conductors at said predetermined junction points.

13. The apparatus of claim 11 wherein said noble first metal conductors are comprised of an alloy of palladium and silver.

14. The apparatus of claim 11, wherein said noble third metal conductors are comprised of an alloy of platinum and gold;
   whereby lowest cost of said circuit apparatus correlates with minimal use of said third metal.

15. The apparatus of claim 11 wherein said fourth metal means includes tin-lead alloy solder.

16. The apparatus of claim 11 wherein said second metal wire bond conductors are comprised of aluminum.

17. The apparatus of claim 11 wherein said first metal conductors are comprised of a palladium and silver alloy, said third metal conductors are comprised of a platinum and gold alloy, said fourth metal means includes a tin-lead-silver alloy solder and said metallic incompatibility includes tin-lead-silver solder leaching of said palladium and silver alloy.

18. The apparatus of claim 11 wherein said apparatus further includes devitrious glass dielectric means for covering selected portions of said first metal and second metal arrays.

19. The apparatus of claim 11 wherein said one circuit conponent connected by said wire bond conductor comprises a surface acoustic wave delay line.

20. The apparatus of claim 19 wherein said delay line includes a lithium niobate crystal structure.

* * * * *

UNITED STATES PATENT AND TRADEMARK OFFICE
CERTIFICATE OF CORRECTION

PATENT NO. : 4,546,283

DATED : October 8, 1985

INVENTOR(S) : Michael D. Adamo et al

It is certified that error appears in the above-identified patent and that said Letters Patent is hereby corrected as shown below:

At col 6, line 12, "Possible" should commence a new paragraph.

At col 7, line 36, "Ag2" should read "Ag 2".

Signed and Sealed this

Fourth Day of March 1986

[SEAL]

Attest:

Attesting Officer

DONALD J. QUIGG

Commissioner of Patents and Trademarks